June 13, 1961 H. Q. NORTH 2,988,676

SEMICONDUCTOR DEVICE

Original Filed July 15, 1957

HARPER Q. NORTH,
INVENTOR.

BY Spensley and Horn

ATTORNEYS.

2,988,676
Patented June 13, 1961

2,988,676

SEMICONDUCTOR DEVICE

Harper Q. North, Palos Verdes Estates, Calif., assignor to Pacific Semiconductors, Inc., Culver City, Calif., a corporation of Delaware Original application July 15, 1957, Ser. No. 672,070. Divided and this application June 13, 1960, Ser. No. 35,566
3 Claims. (Cl. 317—234)

Figure 1:
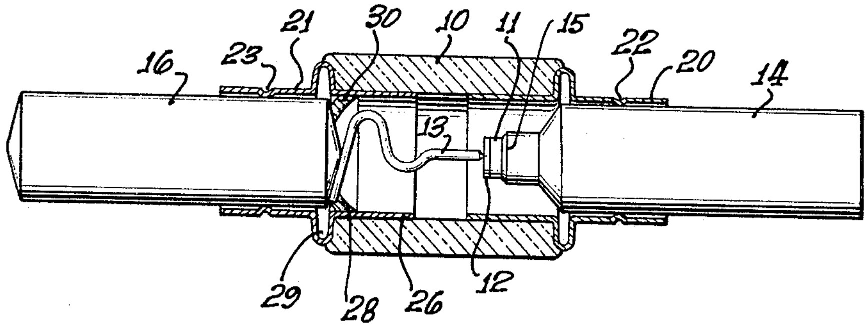

This invention relates to the manufacture of semiconductor devices and more particularly to an improved semiconductor device.

This application is a division of co-pending U.S. application Serial No. 672,070, entitled "Mobile Particle Entrapment Method," by Harper Q. North, filed July 15, 1957.

It has long been recognized in the semiconductor art that a hermetically sealed package, wherein the semiconductor crystal is mounted within a miniaturized cylindrical housing, the central region of which is composed of glass, affords a foundation for designing an ideal package for an electronic device such as a semiconductor diode, for example.

One such prior art package comprises a central glass or ceramic tube which has, sealed therein at the opposite ends thereof, metal wires or electrodes. Several designs, according to the prior art, include metal plugs or pins which are sealed within the central tube through intermediate metal sleeves while the sleeves are themselves sealed to the glass. Typically, one of the metal pins supports the semiconductor crystal while the opposite pin itself makes contact with the crystal or will have affixed between it and the crystal a resilient whisker electrode to make contact with the crystal.

In these and similar packages, a P-N junction must be established in the crystal to achieve the desired electrical characteristics. In the fabrication of the above referred to housing assembly or package, foreign particles will present themselves, either due to the sealing operation itself, or to some other source including the ambient.

These foreign particles often will have a deleterious effect upon the electrical characteristics of the device, particularly a diode or a transistor. There is a high statistical probability that these particles will short-circuit the P-N junction. It is therefore necessary to, in some way, immobilize these particles or at least isolate them from the junction.

One prior art method for effecting this result has been the use of so-called glit or glimp, which is a coating well known to the art. The glit is deposited upon the surface of the semiconductor crystal in the vicinity of the junction to effectively isolate the junction from the ambient and hence the particles under discussion.

In glitted diodes or transistors there is generally found to be a gradual degradation in the electrical characteristics relative to a non-glitted device. In addition, detection of a leak in the hermetic seal of the package housing the device is made considerably more difficult and less accurate when the surface of the semiconductor crystal is coated with glit.

The present invention effectively serves to isolate and render harmless the foreign particles without the above referred to shortcomings attendant with the glit method of the present state of the art.

According to the basic concept of the present invention a chemically inert material which will permanently entrap the foreign particles is introduced into the package housing the device.

In the presently preferred method according to the invention, the entrapping material is introduced in the vicinity of the whisker subassembly, away from the junction. Thereafter the package is hermetically sealed in the usual manner. Then the completed devices containing the entrapping material are vibrated or otherwise agitated while being maintained at a value of temperature at which the entrapping material will attract or otherwise entrap the foreign particles. Finally, the devices are cooled with the particles being permanently entrapped within the inert material.

Accordingly, it is an object of the present invention to provide an improved method for immobilizing foreign particles which are present in a sealed semiconductor package assembly.

Another object of this invention is to provide an improved semiconductor device in which the junction is protected from foreign particles.

Yet another object of this invention is to provide an improved method for permanently immobilizing foreign particles present in a sealed package assembly which will not adversely affect the validity of a subsequent hermetic seal test of the package assembly.

A further object of the present invention is to provide an improved method for isolating foreign particles present in a semiconductor package assembly without deleteriously affecting the electrical characteristics of the device.

Still another object of the present invention is to provide a method for increasing the yield of semiconductor junction devices produced in accordance with present art methods.

Yet another object of the present invention is to provide a method for increasing the reliability of semiconductor devices produced according to methods presently known to the art.

The novel features which are believed to be characteristic of the present invention, together with further objects and advantages thereof will be better understood from the following description considered in connection with the accompanying drawing. It is to be expressly understood, however, that the drawing is for the purpose of illustration and description only, and is not intended as a definition of the limits of the invention.

Figure 2:
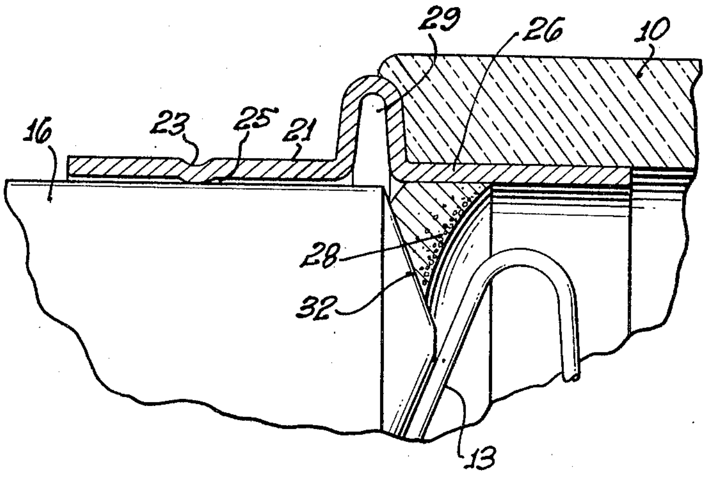

In the drawing:

FIGURE 1 is a greatly enlarged view, partly in section, showing how the method of the present invention may be employed in the manufacture of one particular type of diode; and FIGURE 2 is an enlarged view, partly in section, of the whisker subassembly of the device shown in FIGURE 1.

Referring now to the drawing, there is shown in FIGURE 1, a semiconductor crystal diode produced according to the present invention.

The device may be any type of a sealed device, including a semiconductor diode. By way of example only, in FIGURE 1 there is illustrated a diffused junction silicon diode produced in accordance with the method disclosed and claimed in United States Patent No. 2,827,403 by Thomas C. Hall and Clifford A. Levi, issued on March 18, 1958. Assuming that semiconductor crystal 11 is N-type silicon, the diffused region 12 would be of P-type conductivity resulting in a P-N junction at the interface between region 12 and crystal 11. Crystal 11, may, of course, be of P-type conductivity while region 12 may, by the same token, be of N-type conductivity.

Further, the semiconductor material of crystal 11 may alternately consist of germanium rather than silicon or it may be of a germanium-silicon alloy or of any of the other semiconductor materials known to the art. N-type silicon with a P-type diffused region has merely been selected by way of example for the purposes of clarity and simplicity only.

It will, of course, be appreciated that the diode of FIGURE 1, while exemplified as a diffused junction silicon device, might equally have been a fused junction diode or a so-called point contact or bonded diode. Further, while the method of this invention is described in connection with a diode which is a monojunction device, it is also applicable to a multi-junction device such as a transistor.

The essence of the present invention is the provision of a method and a device for isolating foreign particles present in the package housing assembly which concurrently precludes the heretofore existent disadvantages attendant in present art methods, which methods typically deleteriously affect the electrical characteristics of the junction or junctions in the device.

Molybdenum whisker 13 is shown to be in mutual contact with region 12 of crystal 11 while the other surface thereof may be joined to pin 14 by means of solder 15 or by any other method known to the art. The other end of whisker 13 will typically be welded to a second pin 16. Pins 14 and 16 are each welded to metal sleeves or bumped tubes 20 and 21 at 22 and 23. The sleeves 20 and 21 have been fused to the glass envelope 10 previously to complete the hermetic seal. A detailed description of the method of assembly of a diode similar to that of FIGURE 1 may be found in co-pending United States patent application, Serial No. 497,353, entitled "Glass Sealed Rectifier," by Justice N. Carman, Jr., filed March 21, 1955, and assigned to the assignee of the present invention.

It will be noted in the drawing that there is a space between the sleeve and the pins throughout, except at the welds 22 and 23. Prior to the introduction of pin 14, which carries crystal 11 into sleeve 20, a small quantity, approximately .00025 cubic inch in this embodiment, of entrapping material, such as "Kel-F" which is the trademark for a fluorinated hydrocarbon wax produced by the M. W. Kellogg Company, is introduced into the package in the vicinity of the whisker sub-assembly as shown at 30.

It has been found particularly convenient to introduce the wax into the whisker subassembly in powdered form at room temperature. Kel-F waxes and oils are low molecular weight polymers of chlorotrifluoroethyelne which constitute an homologous series of compounds composed of chlorotrifluoroethylene repeating units and terminal chlorine atoms. This series, referred to as "whole polymer," has the general formula:

$$Cl—(CF_2—CFCl)_xCl$$

One particular Kel-F wax used to advantage in the method of the present invention in the manufacture of a point contact germanium diode is Kellogg's grade 200. At room temperature it is opaque and odorless. It becomes tacky at 70° C., but does not melt below 105° C., yet it will not run until a temperature of 130° C. is exceeded.

In order to keep the entrapping material at the whisker end of the diode, the whisker sub-assembly is heated to a temperature of approximately 105° at which the Kel-F, for example, becomes tacky, and then cooled. Thus, in later handling operations the material 30 will remain where originally placed. This same procedure may be adopted in any other sealed package wherein it is desired to keep the entrapping material in one particular location.

Subsequent to the introduction of the wax or entrapping material 30, metal pin 14 carrying crystal 11 is inserted into sleeve 20 until critical mutual contact is produced between the tip of whisker 13 and surface 12 of crystal 11. Thereafter, pins 14 and 16 are sealed within sleeves 20 and 21 at 22 and 23 respectively by welding, for example, to effect the hermetic seal. The welding heat may cause the entrapping material 30 to permeate the space 25 between pin 16 and sleeve 21 and the bellows region 29 of sleeve 21, as well as the region intermediate the sloped surfaces 32 of pin 16 and portion 26 of sleeve 21 to assume the curved shape essentially as shown in FIGURE 2. This will be avoided if the preliminary step of heating the whisker sub-assembly is taken to localize the material 30. This is due to the fact that when the material is heated to below its melting point, the temperature at which it becomes tacky only, that it will not run in between the pin and the shell, but instead, will stop at a point above the bellows region of the shell 21.

Thereafter, the completed device, together with other such completed devices are placed within an agitating or tumbling apparatus, not shown, and agitated while being maintained at a temperature above room temperature until the material 30 reaches a tacky consistency so that any foreign particles 28 will be entrapped therewithin as may best be seen in FIGURE 2. The foreign particles which may be present within the sealed diode housing assembly are permanently entrapped within material 30, thus effectively removing and isolating them from the P-N junction within crystal 11.

While fluorinated hydrocarbon has been cited by way of example, as the material 30 for entrapping particles 28, other entrapping or sticky materials are equally useful, such as Teflon which is the trade name of an inert hydrocarbon produced by the E. I. Du Pont Company. Further, other polyethylene waxes such as "Epolene N" wax which is the trademark of a wax produced by the Eastman Kodak Company and other chemically inert organic materials including waxes, oils, and greases, are equally appropriate in place of the Kel-F wax referred to hereinbefore.

Basically, what is desired is a material which will permanently entrap the foreign particles, either by an adhesive attraction at the surface, by suspending the particles, or by any other such entrapping mechanism. At the same time the entrapping material must be chemically and electrically inert. It must, further, not suffer from degradation due to age or rapid changes in temperature within the operating limits of the device.

Further, while this invention has been described with reference to a coaxial glass sealed semiconductor glass package such description has been for the purpose of example only. The method of the present invention is equally applicable to metal, ceramic or plastic packages be they coaxial or otherwise, and it is further applicable to transistors as well as diodes.

It should be pointed out that while in the example described herein, the entrapping material has been specified as being placed in the whisker sub-assembly, this should not be considered as a limitation of the invention. Entrapping material 30 may alternately be placed in the crystal sub-assembly or in both the whisker and crystal sub-assemblies. If a package of a different configuration be used, the material may be placed at any strategic location at which the probability of immobilizing the foreign particles is great.

As was previously mentioned, the method of this invention is applicable to all types of semiconductor devices, including so-called gold bonded diodes and other sealed devices. The following experimental data gives some indication of the advantage obtained in relation to reverse characteristics by use of the present invention as contrasted to glit when applied to gold bonded diodes.

In one set of samples at which the leakage current was measured when 50 volts was applied to the diode in the reverse direction it was found, prior to temperature aging, that 90% of the diodes tested which included Kel-F, passed less than 50 microamperes, while only 82% of the glitted diodes passed less than 50 microamperes. After subjection to temperature aging involving the following: placed diodes in 95° ambient for 100 hours, some 20% of the glitted diodes passed less than 50 microamperes while 45% of the diodes containing Kel-F were found to pass less than 50 microamperes.

Another set of samples were tested for $E_B$, i.e., the voltage which was necessary to induce the flow of 1 milliampere in the reverse direction. A diode was considered satisfactory if $E_s$ measured 100 volts or more. It was found that 22% of the glitted gold bonded diodes passed 1 milliampere while only 3% of those containing Kel-F passed that much current. Subsequent to temperature aging as defined hereinabove, the comparable percentages for the glitted diodes was 85% and for the Kel-F diodes, only 43%.

These figures clearly indicate that devices made in accordance with the present invention more than accomplish the objectives sought, i.e., that of reducing junction shorting by foreign particles with far less degradation than is caused by the present art method.

Another advantage of the present art method is that it accomplishes its objectives without covering the semiconductor surface.

What is claimed is:

1. A semiconductor electrical translating device comprising: a semiconductor crystal element; a hermetically sealed package containing said crystal element; first and second electrodes projecting through said package, each of said electrodes being connected to said crystal element within said package; and a chemically inert material within said package remote from said crystal element, said inert material being a non-conductor of electricity and having stable characteristics, said material being selected from the group consisting of fluorinated hydrocarbons and polyethylenes whereby any foreign particles within said enclosure will be entrapped within said material without affecting the electrical characteristics of said device.

2. A semiconductor electrical translating device comprising: a semiconductor crystal element; a hermetically sealed package containing said crystal element; first and second electrodes projecting through said package, each of said electrodes being connected to said crystal element within said package; and a chemically inert material within said package remote from said crystal element, said inert material being a polymer of chlorotrifluoroethylene having the general formula $Cl{-}(CF_2{-}CFCl)_xCl$, where $x$ is a positive integer.

3. A semiconductor electrical translating device comprising: a semiconductor crystal element; a hermetically sealed package containing said crystal element; first and second electrodes projecting through said package, each of said electrodes being connected to said crystal element within said package; and a chemically inert material within said package remote from said crystal element, said inert material being a polymer of ethylene.

References Cited in the file of this patent

UNITED STATES PATENTS

| | | |
|---|---|---|
| 756,676 | Midgley | Apr. 5, 1904 |
| 2,460,109 | Southworth | Jan. 25, 1949 |